US008431464B2

(12) United States Patent
Kobayashi et al.

(10) Patent No.: US 8,431,464 B2
(45) Date of Patent: Apr. 30, 2013

(54) PROCESS FOR PRODUCING SILICIC COATING, SILICIC COATING AND SEMICONDUCTOR DEVICE

(75) Inventors: Yasushi Kobayashi, Kawasaki (JP);
Kouta Yoshikawa, Kawasaki (JP);
Yoshihiro Nakata, Kawasaki (JP);
Tadahiro Imada, Kawasaki (JP); Shirou Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 267 days.

(21) Appl. No.: 12/700,215

(22) Filed: Feb. 4, 2010

(65) Prior Publication Data
US 2010/0133692 A1 Jun. 3, 2010

Related U.S. Application Data

(63) Continuation of application No. PCT/JP2007/000981, filed on Sep. 10, 2007.

(51) Int. Cl.
*H01L 21/76* (2006.01)

(52) U.S. Cl.
USPC ........... 438/424; 438/637; 438/781; 427/335; 427/388.1; 427/204

(58) Field of Classification Search .................. 438/424, 438/637, 781; 427/335, 388.1, 121, 204, 427/2.13, 410
See application file for complete search history.

(56) References Cited

U.S. PATENT DOCUMENTS

| 7,439,605 | B2* | 10/2008 | Kobayashi et al. ........... 257/522 |
| 2004/0115955 | A1 | 6/2004 | Motoyama et al. |
| 2004/0121264 | A1* | 6/2004 | Liegl et al. .................... 430/311 |
| 2004/0152334 | A1 | 8/2004 | Ohto et al. |
| 2005/0052751 | A1* | 3/2005 | Liu et al. ........................ 359/626 |
| 2005/0179103 | A1 | 8/2005 | Nakai et al. |
| 2005/0205991 | A1* | 9/2005 | Chen et al. .................... 257/734 |
| 2006/0017154 | A1* | 1/2006 | Eguchi et al. ................. 257/701 |
| 2006/0088714 | A1* | 4/2006 | Zaghib et al. ................. 428/404 |
| 2006/0189163 | A1 | 8/2006 | Motoyama et al. |
| 2007/0093640 | A1 | 4/2007 | Kim et al. |
| 2007/0098879 | A1* | 5/2007 | Makiura ......................... 427/66 |
| 2007/0190461 | A1 | 8/2007 | Ozaki et al. |

(Continued)

FOREIGN PATENT DOCUMENTS

JP 2003-031569 A 1/2003
JP 3585384 B2 11/2004

(Continued)

OTHER PUBLICATIONS

German Office Action dated Aug. 23, 2011, issued in corresponding German Patent Application No. 112007003638.9.(w/partial English translation).

(Continued)

*Primary Examiner* — Telly Green
(74) *Attorney, Agent, or Firm* — Westerman, Hattori, Daniels & Adrian, LLP

(57) ABSTRACT

A silicic coating of 2.4 g/cm$^3$ or higher density, obtained by forming a silicic coating precursor with the use of at least one type of silane compound having a photosensitive functional group and thereafter irradiating the silicic coating precursor with at least one type of light. This silicic coating can be used as a novel barrier film or stopper film for semiconductor device.

19 Claims, 6 Drawing Sheets

STEP 11

U.S. PATENT DOCUMENTS

| | | | |
|---|---|---|---|
| 2007/0215864 A1* | 9/2007 | Luebben et al. | 257/40 |
| 2007/0246804 A1 | 10/2007 | Ohto et al. | |
| 2009/0309116 A1* | 12/2009 | Kato et al. | 257/98 |
| 2010/0176496 A1 | 7/2010 | Ozaki et al. | |

FOREIGN PATENT DOCUMENTS

| | | | |
|---|---|---|---|
| JP | 2006-190872 A | | 7/2006 |
| JP | 2006190872 A | * | 7/2006 |
| JP | 2007-220750 A | | 8/2007 |
| JP | 2007-523484 A | | 8/2007 |
| KR | 10-058625 B1 | | 1/2006 |
| KR | 10-0602881 B1 | | 7/2006 |
| KR | 10-0649917 B1 | | 11/2006 |
| WO | 2005/080629 A2 | | 9/2005 |

OTHER PUBLICATIONS

International Search Report of PCT/JP2007/000981, mailing date of Nov. 20, 2007.

Taiwanese Office Action dated Apr. 8, 2011, issued in corresponding Taiwanese Patent Application No. 096133684.

Korean Office Action dated Jun. 15, 2011, issued in corresponding Korean Patent Application No. 10-2010-7005252.

Japanese Office Action dated Aug. 21, 2012, issued in corresponding Japanese Patent Application No. 2009-531981, (7 pages). With English Translation.

* cited by examiner

FIG. 3
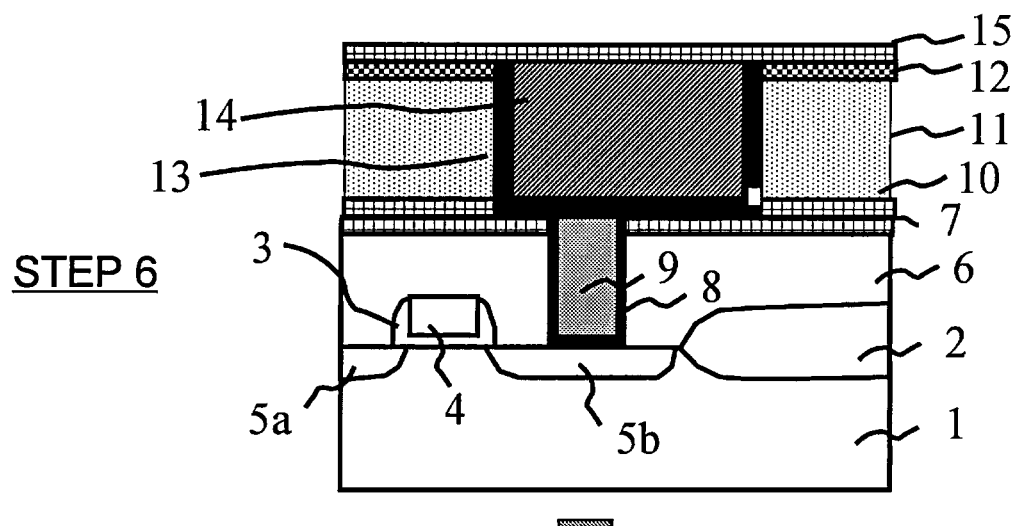
STEP 6
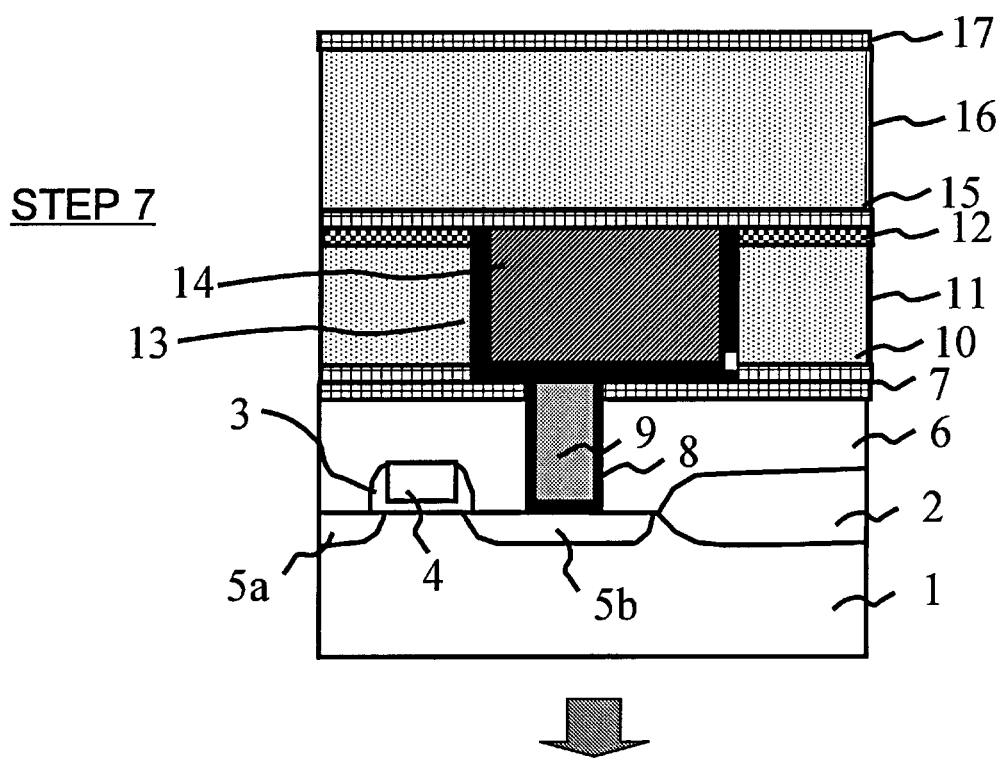
STEP 7

STEP 8

FIG. 5
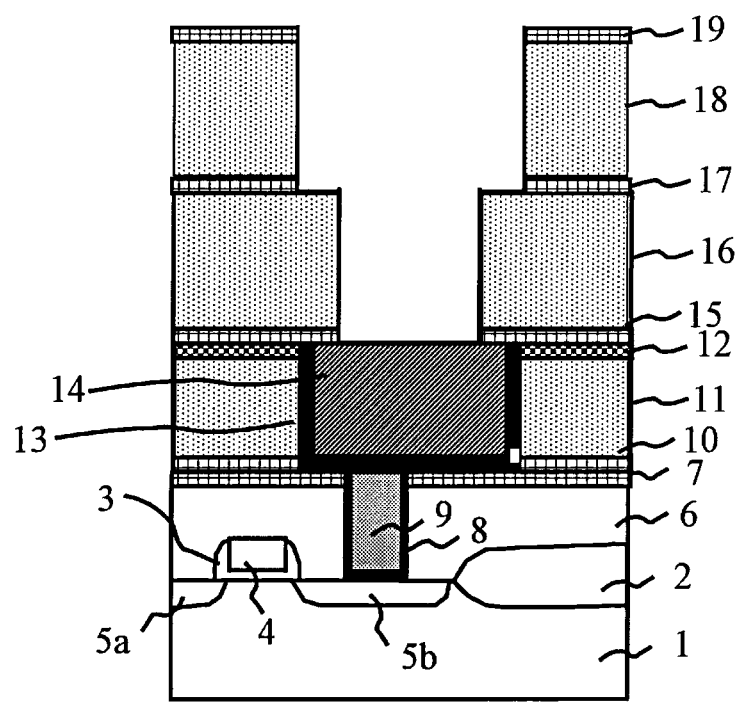
STEP 9
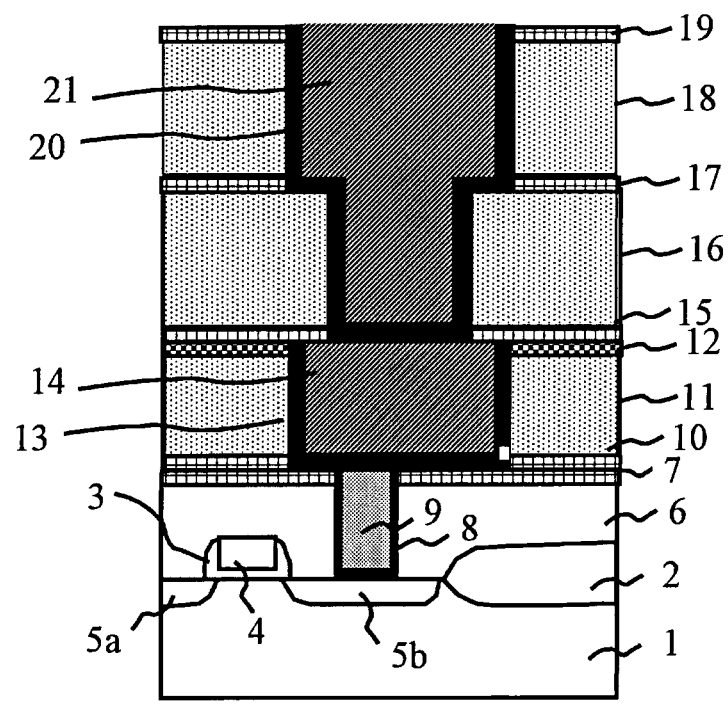
STEP 10

STEP 11

PROCESS FOR PRODUCING SILICIC COATING, SILICIC COATING AND SEMICONDUCTOR DEVICE

CROSS-REFERENCE TO RELATED APPLICATIONS

This application is a continuation of international application PCT/JP2007/000981, filed on Sep. 10, 2007.

TECHNICAL FIELD

The present invention relates to barrier films, stopper films and the like used in semiconductor devices.

BACKGROUND OF THE INVENTION

With the rising level of integration in semiconductor device integrated circuits and with higher device densities, there has been a growing demand for multilayer structures, particularly in semiconductor device elements. This trend toward higher integration results in narrower line spacings, which has led to the problem of wire delay due to increased capacitance between lines {see Japanese Patent No. 3585384 (Paragraph No. 0002)}.

More specifically, although declines in signal propagation speed due to the parasitic capacitance of dielectric films have hitherto been known to occur, in generations of semiconductor devices with line spacings of more than 1 μm, wire delay had only a small effect on the device as a whole. However, at line spacings of 1 μm or less, wire delay has an increased influence on device speed; in particular, when circuits are formed at line spacings of 0.1 μm or less, the parasitic capacitance between lines exerts a large influence on device speed.

The wire delay (T) is affected both by the wiring resistance (R) and the capacitance (C) between lines, as illustrated by formula (8) below.

$$T \propto \mu C R \quad (8)$$

The relationship between C in formula (8) and the dielectric constant $\in$ is shown in formula (9).

$$C = \in_o \in_r S/d \quad (9)$$

In formula (9), S is the electrode surface area, $\in_o$ is the dielectric constant of a vacuum, $\in_r$ is the dielectric constant of the dielectric film, and d is the line spacing.

Hence, lowering the resistance of the wiring and lowering the dielectric constant of the dielectric film are effective ways to make the wire delay smaller.

Up until now, low dielectric constant dielectric films in semiconductor integrated circuits have been made primarily of silicon compound-based materials, and copper has been used for the metal wiring in the multilayer wiring structures of semiconductor integrated circuits. When a barrier layer is not used in this case, thermal diffusion, etc. of the copper may result in copper infiltration into the silicon compound-based material, possibly causing the insulating properties of the low dielectric constant dielectric film to deteriorate. Hence, deterioration in the insulating properties of a silicon compound-based low dielectric constant dielectric film is currently prevented by forming a barrier film between the copper and the low dielectric constant dielectric film.

Metallic materials are used today in the barrier films of semiconductor integrated circuits (these films are called "barrier metal films"). For example, barrier metal films currently in use have a large thickness of about 10 nm, and are typically made of a metal-based material such as TaN or tantalum which has a large resistance. However, metal-based materials used as the barrier film have a high electrical resistance compared with the wiring metal, and thus increase the line resistance of the semiconductor device as a whole. This is an impediment to high-speed operation and high reliability in semiconductor integrated circuits.

SUMMARY OF THE INVENTION

It is therefore an object of the present invention to solve the above-described problems, and to provide a film, particularly a film which serves as an excellent barrier film or stopper film, and to provide semiconductor devices which use such films. Here, the film of the present invention which is referred to as a "barrier film" is a film intended for use in place of conventional barrier metal films. The copper diffusion-preventing properties of the inventive film make it possible to replace substantially all parts where conventional barrier metal films are employed over with this barrier film. Further objects and advantages of the invention will become apparent from the following description.

According to a first aspect, the invention provides a method of producing a silicic coating included in a semiconductor device and having a density of at least 2.4 g/cm³, the method including: forming a silicic coating precursor by using at least one type of silane compound having a photosensitive functional group; and thereafter irradiating the silicic coating precursor with at least one type of light, either alone or in combination, to obtain the silicic coating.

Through this aspect of the invention, there is provided a novel film for semiconductor devices. This film may be used as a barrier film or a stopper film. When used as a barrier film, it can help to lower the wiring resistance. When used as a stopper film, a selectivity (ratio of the time required to reduce unit thickness of a silicic coating according to present invention to the time required to reduce unit thickness of other materials) improving effect is obtainable in etching and chemical mechanical polishing (CMP). The inventive film also can help lower the dielectric constant. Thus, by means of this aspect of the invention, there can be achieved semiconductor devices which have a low dielectric constant and a low wiring resistance and which are endowed with excellent high-speed operation and a high reliability.

In various preferred embodiments, the silicic coating includes a barrier film; wiring in contact with the barrier film is copper wiring; the silicic coating includes an etching stopper film; the silicic coating includes a stopper film in chemical mechanical polishing; the silane compound includes a compound represented by any one of general formulas (1) to (3) below

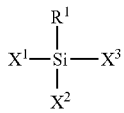
(3)

(wherein in formulas (1) to (3), $R^1$, $R^2$ and $R^3$ are each independently hydrogen, an aliphatic hydrocarbon group of 1 to 4 carbons, an aromatic hydrocarbon group of 6 to 8 carbons which may include a substituent, or a heteroaromatic group of 4 to 8 carbons which may include a substituent; and $X^1$, $X^2$ and $X^3$ are each independently chloro, hydroxyl, an alkoxy group of 1 to 3 carbons, or an alkylamino group of 1 to 4 carbons, with the proviso that each of formulas (1) to (3) contains at least one photosensitive functional group as $R^1$, $R^2$ and/or $R^3$); the silane compound includes a nitrogen-mediated compound obtained by removing at least one of $X^1$, $X^2$ and $X^3$ from each of at least two compounds selected from the group consisting of compounds represented by any one of formulas (1) to (3), and bonding together the at least two compounds through nitrogen; the nitrogen-mediated compound includes a compound represented by any one of formulas (4) to (7)

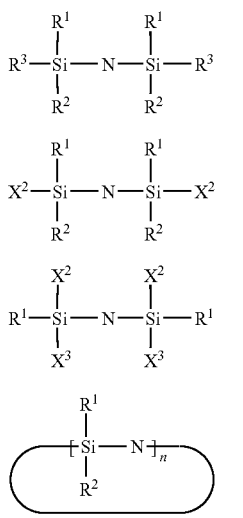

(wherein in formulas (4) to (7), $R^1$, $R^2$ and $R^3$ are each independently hydrogen, an aliphatic hydrocarbon group of 1 to 4 carbons, an aromatic hydrocarbon group of 6 to 8 carbons which may include a substituent, or a heteroaromatic substituent of 4 to 8 carbons which may include a substituent; $X^2$ and $X^3$ are each independently chloro, hydroxyl, an alkoxy group of 1 to 3 carbons, or an alkylamino group of 1 to 4 carbons; and the letter n is an integer from 3 to 5, with the proviso that each of formulas (4) to (7) contains at least one photosensitive functional group as $R^1$, $R^2$ and/or $R^3$); the photosensitive functional group is a group selected from the group consisting of phenyl, vinyl and pyridinyl; the number of photosensitive functional groups which bond to one silicon atom on the silane compound is at least two, the number of photosensitive functional groups which bond to one silicon atom on the silane compound being in particular three; the light is ultraviolet light or an electron beam, the ultraviolet light being in particular vacuum ultraviolet light; the method further includes carrying out heat treatment; and/or the heat treatment is carried out at any one time from among before the light irradiation, during the light irradiation and after the light irradiation.

According to further aspects of the invention, a silicic coating produced by the above method, and a semiconductor device which includes a silicic coating produced by the above method are provided. This semiconductor device is preferably one which includes a multilayer wiring structure.

By means of these aspects of the invention, there is provided a novel film for use in semiconductor devices. This film, by serving as a barrier film or a stopper film, is able to help lower the wiring resistance, improve the selectivity in etching and CMP, and lower the dielectric constant. In this way, the invention makes it possible to achieve semiconductor devices which have a low dielectric constant and a low wiring resistance, and which are endowed with excellent high-speed operation and a high reliability.

The present invention provides a novel film for semiconductor devices. This film may be used as a barrier film or a stopper film. When used as a barrier film, it can help lower the wiring resistance. When used as a stopper film, a selectivity improving effect can be obtained in etching and CMP. The inventive film also helps lower the dielectric constant. In addition, because of its excellent adherence with dielectric films, it can help improve the manufacturing yield. Accordingly, with this invention, there can be obtained semiconductor devices which have a low dielectric constant and a low wiring resistance, and which are endowed with excellent high-speed operation and a high reliability.

BRIEF DESCRIPTION OF THE DRAWINGS

FIG. 3 is a cross-sectional diagram of a multilayer wiring structure under production;
FIG. 5 is a cross-sectional diagram of a multilayer wiring structure under production.

EXPLANATION OF REFERENCE NUMERALS

Figure 1:
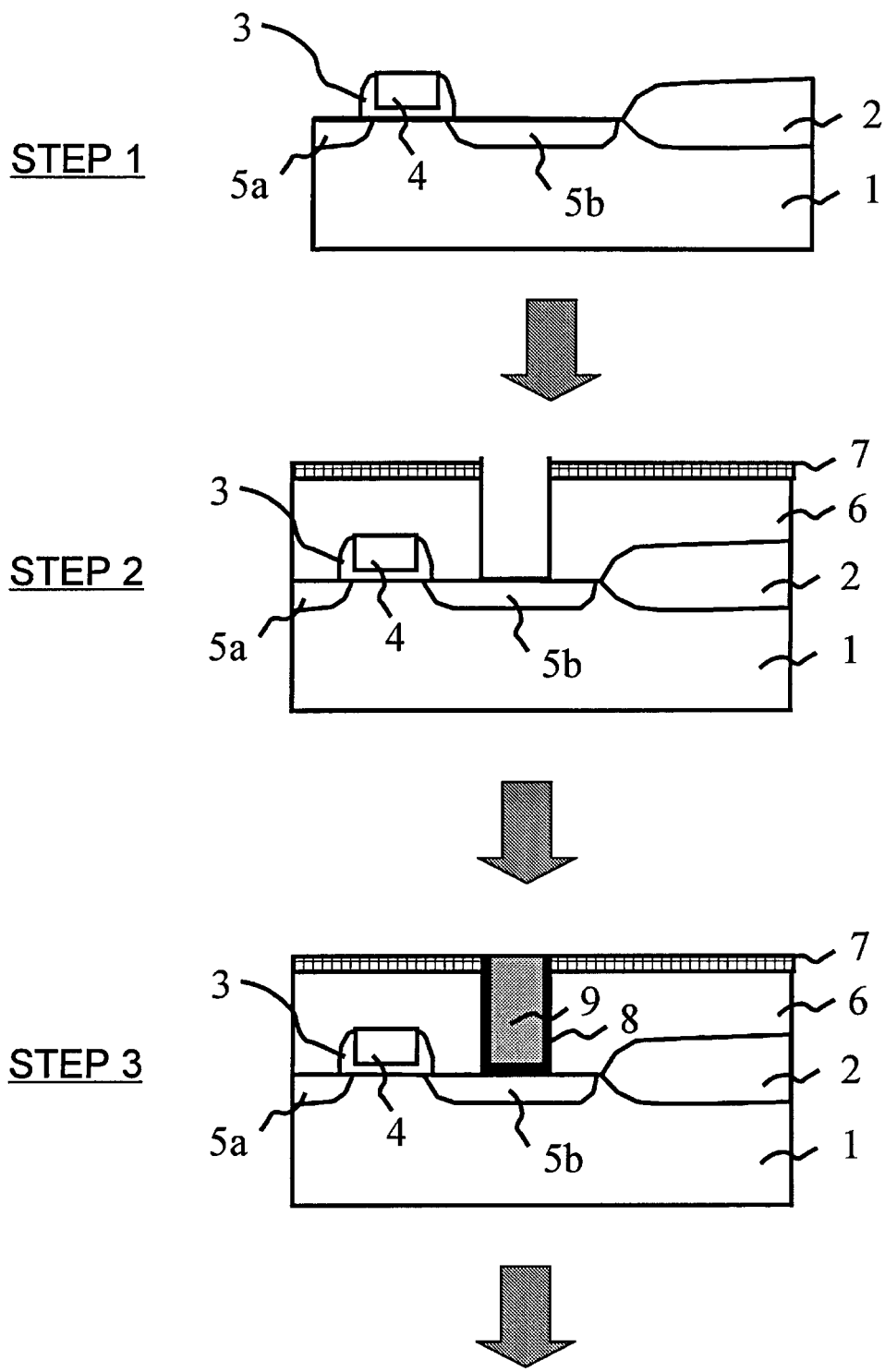
FIG. 1 is a cross-sectional diagram of a multilayer wiring structure under production.

1 Silicon wafer
3 Sidewall dielectric film
5a Source diffusion layer
5b Drain diffusion layer
6 Interlayer dielectric
7 Stopper film
8 TiN barrier metal film
9 Blanket tungsten
10 Test film (i.e., silicic coating according to the invention)
11 Porous silicon-containing dielectric film
12 Test film
13 Test film
14 Copper
15 Diffusion-preventing film
16 Porous silicon-containing dielectric film
17 Test film
18 Porous silicon-containing dielectric film
19 Test film
20 Test film
21 Copper
22 Diffusion-preventing film

DESCRIPTION OF THE PREFERRED EMBODIMENTS

Embodiments of the invention are described below while referring to the accompanying diagrams. However, the technical scope of the invention is not limited by the examples shown in the following embodiments and diagrams, and encompasses the inventions recited in the claims and equivalents thereof.

By using a photosensitive functional group-containing silane compound to form a silane film, then irradiating the film with light to induce reaction of the photosensitive functional groups and also increasing the density of the film by crosslinking or the like, success was achieved in conferring the film that had formed with a wiring metal diffusion-preventing function or a stopper film function. This is apparently because the photosensitive functional groups present in the silane film were photopolymerized, increasing the film density and thus enabling the formation of a dense film impermeable to wiring metal atoms.

When the inventive film is used as a barrier film, the cross-sectional surface area of the wiring layer can be increased in the same degree to which the film thickness is decreased compared with conventional barrier films. This makes it possible to prevent diffusion of the wiring metal to interlayer dielectric films while at the same time reducing the wiring resistance. As a result, semiconductor devices having a high reliability at high speeds can be provided. No particular limitation is imposed on the wiring material which is in contact with the barrier film; wiring made of known materials may be employed as the wiring of the present invention. Illustrative examples of the wiring material include copper, aluminum, tungsten and polysilicon. It is highly practical, and thus particularly desirable, for the wiring in contact with the barrier film to be copper lines.

The film of the invention is very thin and has a high adherence. Moreover, because it is hard and has a composition that differs considerably from that of conventional interlayer dielectrics, it was additionally found to be capable of use as an etching stopper film or a CMP stopper film. By employing the film of the invention as an etching stopper film or a CMP stopper film, for example, the selectivity in etching and CMP can be enhanced. Also, a dielectric constant-lowering effect owing to the use of a thinner film can also be obtained.

The silicic coating of the invention is a film which is included in a semiconductor device. It can be produced by a method which includes forming a silicic coating precursor by using at least one type of silane compound having a photosensitive functional group, then irradiating the silicic coating precursor with at least one type of light, either alone or in combination. The inventive film has a density of at least 2.4 $g/cm^2$.

The silicic coating of the invention may be any type of film included in a semiconductor device. The semiconductor device is most preferably one having a multilayer wiring structure.

In terms of practical applications, the silicic coating of the invention is preferably used as a barrier film. Alternatively, use as a stopper film, such as an etching stopper film or a CMP stopper film, is also preferred. Because the silicic coating of the invention may also serve as a dielectric film, where desired, use as other types of dielectric films is also possible; use in applications that exhibit a plurality of functions is possible as well. That is, use in applications involving any combination of a dielectric function, a wiring metal diffusion-preventing function and a stopper function is possible.

An approach that was taken earlier in other dielectric films formed from silicon compounds was to lower the density by introducing pores in order to reduce the dielectric constant. However, it was discovered that by doing the reverse, that is, by increasing the density, a structure capable of exhibiting characteristics desirable as a barrier film or a stopper film can be obtained. It is critical for the density to be at least 2.4 $g/cm^3$. A density of at least 2.7 $g/cm^3$ is more preferred. By setting the density to at least this value, a wiring metal diffusion-preventing function or a stopper function suitable for a semiconductor device can be achieved. So long as the density is at least 2.4 $g/cm^3$, it is acceptable for pores to be present within the film, although it is generally preferable for the film to be free of pores.

To increase the density of the silicic coating of the invention, it is important of course to avoid as much as possible allowing pores to form at the interior, such as by not carrying out rapid solvent removal. However, it is also important to increase the degree of crosslinking by introducing a suitable amount of photosensitive functional groups.

Although the thickness of the silicic coating of the invention is not subject to any particular limitation, both in cases where it functions as a barrier film and in cases where it functions as a stopper film, the inventive film can help to increase the dielectric constant as a dielectric film. Accordingly, it is advantageous for the inventive film to be as thin as possible. Setting the film thickness to less than 2 nm is easy, and selecting such a film thickness is advantageous in many cases. For example, in the case of use as a barrier film, compared with conventional barrier metal films of TaN or the like which have had to be set to a thickness of about 10 nm, a thickness of less than 2 nm suffices for the silicic coating. This allows the thickness of the wiring layer to be increased correspondingly, thus making it possible to lower the wiring resistance.

The silane compound of the invention encompasses compounds wherein the hydrogens on silanes (signifying compounds of the formula $Si_nH_{2n+2}$), have been substituted with other groups, and compounds obtained by bonding such substituted compounds together through the substituents. The silane compound is not subject to any particular limitation, provided it has a photosensitive functional group; suitable use may be made of known compounds and derivatives thereof. The silane compound according to the invention may include impurities in a degree that does not interfere with the effects of the invention.

The photosensitive functional group of the invention is not subject to any particular limitation, provided it is a group which gives rise to a chemical reaction under irradiation with light, and may be suitably selected from among moieties that are known as photosensitive functional groups. Illustrative examples of such photosensitive functional groups include vinyl, acryloyl, benzyl, phenyl, carbonyl, carboxy, diazo, azido, cinnamoyl, acrylate, cinnamylidene, cyanocinnamylidene, furylpentadiene, p-phenylenediacrylate and pyridinyl groups. Of these, vinyl, phenyl and pyridinyl groups readily give rise to chemical reactions when irradiated with light, and are thus preferred.

The number of photosensitive functional groups included in a single molecule is not subject to any particular limitation. In general, a higher number of photosensitive functional groups is more advantageous because the degree of crosslinking increases accordingly. However, this is not always strictly the case as production becomes more difficult and drawbacks such as a slowing of the chemical reactions elicited by light irradiation also arise. For easy production, rapid chemical reactions upon irradiation with light, and facilitating an increase in the density of the film that has formed, the number of photosensitive functional groups which bond to a single atom of silicon on the silane compound is preferably at least two or more, and more preferably three.

The silicic coating precursor of the invention is a concept which encompasses everything from a film obtained using the silane compound of the invention to a film in the state immediately prior to formation of the silicic coating of the invention. That is, both films composed of the silane compound itself and films obtained by heating such a silane compound film and having an improved adherence to the workpiece (sometimes referred to herein simply as the "underlying material") on which the silicic coating of the invention is to be formed are silicic coating precursors according to the present invention. The silicic coating precursor of the invention may be formed by any method. An illustrative example is a method wherein a solution of the silane compound of the invention dissolved in a solvent or, in cases where the silane compound of the invention is a liquid, the silane compound of the invention itself or a solution thereof is coated or sprayed onto the underlying material, then is heated or otherwise treated to remove the solvent. The coating method is not subject to any particular limitation and may be suitably selected according to the intended purpose. Illustrative examples include spin coating, dip coating, kneader coating, curtain coating and blade coating. Of these, from the standpoint of the ability to easily achieve a thin and uniform film, or the standpoint of coating efficiency or the like, a spin coating method is preferred. In the case of spin coating, exemplary conditions are a spinning rate of from about 100 to about 10,000 rpm, and preferably from 800 to 5,000 rpm, for a period of from about 1 second to about 10 minutes, and preferably from 10 to 90 seconds.

The solvent used is not subject to any particular limitation, provided it is capable of dissolving the silane compound of the invention and the solution has a good coatability. The solvent may be suitably selected from among known solvents. Illustrative examples of the solvent include methanol, ethanol, propanol, cyclohexanone, acetone, methyl isobutyl ketone, methyl ethyl ketone, methyl cellosolve, ethyl cellosolve, octane, decane, hexane, propylene glycol, propylene glycol monomethyl ether acetate, dioxane, diethyl ether, diethylene glycol, dimethyl sulfate, propylene glycol monomethyl ether, propylene glycol monoethyl ether, propylene glycol monopropyl ether and tetrahydrofuran. If the silane compound is a liquid, it may be acceptable to not use a solvent.

The silane compound of the invention preferably includes a compound represented by any one of general formulas (1) to (3) below, or includes a nitrogen-mediated compound obtained by removing at least one of $X^1$, $X^2$ and $X^3$ from each of at least two compounds selected from the group consisting of compounds represented by any one of formulas (1) to (3) and bonding together the at least two compounds through nitrogen.

It is more preferable for the silane compound of the invention to be substantially a compound represented by any one of formulas (1) to (3) alone, the foregoing nitrogen-mediated compound alone, or substantially a compound represented by any one of formulas (1) to (3) and the foregoing nitrogen-mediated compound alone. Throughout the present invention, "substantially" signifies that the presence of impurities in a degree that does not interfere with the effects of the invention is allowable.

The above nitrogen-mediated compound is generally called a silazane. Such a nitrogen-mediated compound preferably includes a compound represented by any one of formulas (4) to (7), and more preferably is composed substantially of a compound represented by any one of formulas (4) to (7).

Such compounds include many compounds which are readily available or easy to synthesize from readily available starting materials, which are easily formed as a film, and which readily crosslink under light irradiation. The compounds represented by formula (7) are cyclic compounds.

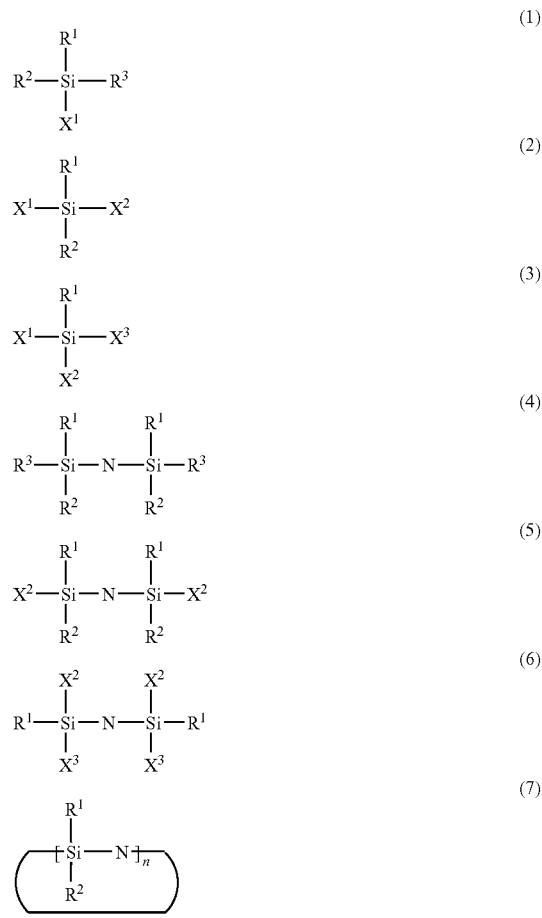

In formulas (1) to (7), $R^1$, $R^2$ and $R^3$ are each independently hydrogen, an aliphatic hydrocarbon group of 1 to 4 carbons, an aromatic hydrocarbon group of 6 to 8 carbons which may include a substituent, or a heteroaromatic group of 4 to 8 carbons which may include a substituent; $X^1$, $X^2$ and $X^3$ are each independently chloro, hydroxyl, an alkoxy group of 1 to 3 carbons, or an alkylamino group of 1 to 4 carbons; and the letter n is an integer from 3 to 5; with the proviso that each of formulas (1) to (3) contains at least one photosensitive functional group as $R^1$, $R^2$ and/or $R^3$, and each of formulas (4) to (7) contains at least one photosensitive functional group as $R^1$, $R^2$ and/or $R^3$.

The photosensitive functional group is thus any one of $R^1$, $R^2$ and $R^3$, although $R^1$, $R^2$ and $R^3$ may include moieties which are not photosensitive functional groups. For example, the above-mentioned aliphatic hydrocarbon group may be a saturated aliphatic hydrocarbon group or an unsaturated aliphatic hydrocarbon group; if it is a saturated aliphatic hydrocarbon group, it cannot serve as a photosensitive functional group. Moieties which can actually be used as the photosensitive functional group and moieties which are preferred as the photosensitive functional group have been described above.

The type of substituent in the aromatic hydrocarbon group of 6 to 8 carbons which may include a substituent and the heteroaromatic group of 4 to 8 carbons which may include a substituent is not subject to any particular limitation. The substituent may even be a photosensitive functional group. Generally, in order for the structure to be simpler, it is preferable to have an alkyl group of 1 to 4 carbons present as the substituent or for there to be no substituent.

$X^1$, $X^2$, $X^3$ and the silazane bond are moieties for increasing adherence with the underlying surface. Such an underlying material is not subject to any particular limitation. However, because the silicic coating of the invention includes silicon as one of the main components, it is preferable for the underlying material to be a dielectric film which similarly includes silicon as one of the main components. Specifically, adherence with the underlying material is thought to improve because $X^1$, $X^2$, $X^3$ and the silazane bond have an Si—OH bond, or form an Si—OH bond by reacting with moisture in the system and hydrolyzing, and this Si—OH dehydratively bonds with Si—OH on the underlying material to form a strong bond. An excellent adherence with the dielectric film is very helpful for improving the yield in multilayer wiring formation.

When the silicic coating precursor of the invention is formed over wiring, adherence between the wiring metal and the silicic coating is believed to be inferior to adherence between a dielectric film and the silicic coating. Therefore, it appears to be desirable to avoid a method wherein many wiring metal surfaces are present as the underlying material serving as the workpiece on which the silicic coating precursor of the invention is deposited. However, even in cases where wiring metal surfaces are present in the underlying material, it is possible for problems to be avoided if, at the same time, many areas of the underlying material are made of a material having excellent adherence with the silicic coating of the invention (for example, when the wiring portions do not exceed a given amount in cases where the silicic coating precursor of the invention is coated onto a surface in which wiring has been buried over a dielectric film).

A porous interlayer dielectric film, so-called on account of the pores at the film interior, is suitable as the underlying material in the invention because it is able to achieve a low dielectric constant. Illustrative examples of such films include carbon-doped $SiO_2$ films formed by vapor phase deposition, porous carbon-doped $SiO_2$ films obtained by adding a heat-degradable compound to a carbon-doped $SiO_2$ film and thereby forming pores, and porous silica films or organic porous films formed by spin coating. Of the above, from the standpoint of pore control and density control, a porous silicon-containing dielectric film formed by a spin coating method is preferred. Examples of such porous silicon-containing dielectric films formed by spin coating include films obtained by adding a heat-degradable organic compound or the like to a polymer formed by the hydrolysis/polycondensation of, for example, tetraalkoxysilane, trialkoxysilane, methyltrialkoxysilane, ethyltrialkoxysilane, propyltrialkoxysilane, phenyltrialkoxysilane, vinyltrialkoxysilane, allyltrialkoxysilane, glycidyltrialkoxysilane, dialkoxysilane, dimethyldialkoxysilane, diethyldialkoxysilane, dipropyldialkoxysilane, diphenyldialkoxysilane, divinyldialkoxysilane, diallyldialkoxysilane, diglycidyldialkoxysilane, phenylmethyldialkoxysilane, phenylethyldialkoxysilane, phenylpropyltrialkoxysilane, phenylvinyldialkoxysilane, phenylallyldialkoxysilane, phenylglycidyldialkoxysilane, methylvinyldialkoxysilane, ethylvinyldialkoxysilane or propylvinyldialkoxysilane, and heating to form pores. More preferably, use may be made of a cluster-type porous silica precursor formed from a quaternary alkylamine because this has a small pore size and uniform pores.

In the inventive method of producing a silicic coating, when a solution of the silane compound of the invention is used, heat treatment must be carried out in order to remove the solvent and promote adherence with the underlying material (presumably to promote Si—O—Si bonding). If the heating temperature is too high, self-condensation reactions by the silane compound of the invention may arise. It is thus preferable during solvent removal to carry out heating at a somewhat low temperature to avoid such reactions. That is, heating at temperatures in at least two stages is preferred. Because heating for the sake of improving adherence does not in itself require light irradiation, such heating may be carried out prior to light irradiation, although it is also possible to carry out such heating at the same time as, or after, light irradiation. It is also possible for heating during light irradiation to promote the chemical reactions elicited by light irradiation.

The heating conditions are difficult to strictly specify because of the above various factors which are included, and so it is desirable that these conditions be determined empirically. In general, however, a temperature of not more than 150° C. is preferred for solvent removal. To improve adherence, a temperature in a range of from 50 to 400° C. is preferred. A temperature in a range of from room temperature to 400° C. is preferred for promoting chemical reactions by light irradiation.

The light used for light irradiation according to the invention is not subject to any particular limitation, provided it is able, at reduced pressure or standard pressure, to provoke a reaction of the photosensitive functional group according to the invention and thereby induce photopolymerization. Illustrative examples include ultraviolet light (UV), an electron beam, laser light, x-rays and microwaves. Ultraviolet light or an electron beam is preferred. From the standpoint of irradiation efficiency, it is preferable to shine the ultraviolet light in a vacuum.

Ultraviolet light is classified as UV-A having a wavelength of 315 to 400 nm, UV-B having a wavelength of 280 to 315 nm, UV-C having a wavelength of 200 to 280 nm, and VUV (vacuum ultraviolet) having a wavelength of 10 to 200 nm. The ultraviolet light used for light irradiation according to the present invention may be any of these, although UV-C is especially preferred. This is because irradiation having a good efficiency over a broad spectrum at the same time is possible, enabling short-duration treatment. At the time of irradiation, a stream of inert gas such as nitrogen or argon may be passed through to adjust the pressure or for modification. At a temperature range of up to 400° C., irradiation may be carried out while heating in a single step or a plurality of steps. This is to promote the photopolymerization reaction and thus enable treatment to be carried out in a shorter time. The number of heating steps may be suitably selected as required.

The silicic coating produced by the method of the invention may be advantageously used as a barrier film, an etching stopper film or a CMP stopper film. Semiconductor devices with such films have a low dielectric constant and a low wiring resistance, enabling high-speed operation and a high reliability to be achieved. The silicic coating of the invention is thus particularly well-suited for use in semiconductor devices having a multilayer wiring structure.

EXAMPLES

Examples of the invention and comparative examples are described below.

Examples 1 to 7

(1) A porous silicon-containing dielectric film (an $SiO_2$-like film containing primarily silicon and oxygen, and also containing carbon and hydrogen; Ceramate NCS, produced by JGC Catalysts and Chemicals, Ltd.) formed on a silicon substrate was produced.

(2) Silane compound solutions prepared by mixing 0.1 mol of the respective silane compounds shown in Table 1 (corresponding to the "silane compound" of the invention) with 0.2 mol of methyl isobutyl ketone as the solvent were coated onto the porous silicic coating produced in (1) by spin coating at a spin rate of 2,000 rpm for a coating period of 30 seconds. The silicon substrate was then placed on a hot plate set at 100° C., and solvent drying was carried out for 1 minute.

(3) Next, the porous silicon-containing dielectric films with the respective silicic coatings obtained in (2) were subjected to the light irradiation shown in Table 1. A high-pressure mercury-vapor lamp (wavelength, 200 to 600 nm) was used as the source of ultraviolet light. Irradiation was carried out for 10 minutes at a predetermined temperature (room temperature, when not specified as 400° C.).

(4) Next, the film thickness was measured. The thickness of each silicic coating was measured using a transmission electron microscope.

(5) Next, the adherence of the film to the underlying material was measured. Adherence measurement consisted of measuring the adherence of the deposited film in each example by the stud-pull test. This involved bonding an aluminum pin to each silicic coating with an epoxy resin, then pulling the pin, examining the area of failure when failure occurs, and determining the tensile strength at failure.

(6) Next, the etching selectivity was measured. A porous silicon-containing dielectric film not subjected to any treatment and the porous silicon-containing dielectric films on a silicic coating of Examples 1 to 7 were dry etched with a fluorine plasma obtained from $CF_4/CHF_3$ gas as the starting material until the silicon substrate surface emerged. The etching selectivity was calculated from the difference between the etching time of the porous silicon-containing dielectric film (A) and the etching time of the porous silicon-containing dielectric films on a silicic coating of Examples 1 to 7 (B). That is, the etching selectivity was {(B-A)/(thickness of silicic coating of the invention)}/{A/(thickness of porous silicon-containing dielectric film)}.

(7) Next, the density of the silicic coating of Examples 1 to 7 was measured by x-ray reflectivity.

The results are presented collectively in Table 1. In Table 1, "functional group X" refers to any one of $X^1$, $X^2$, $X^3$ or a silazane bond.

Examples 8 to 14

Figure 2:
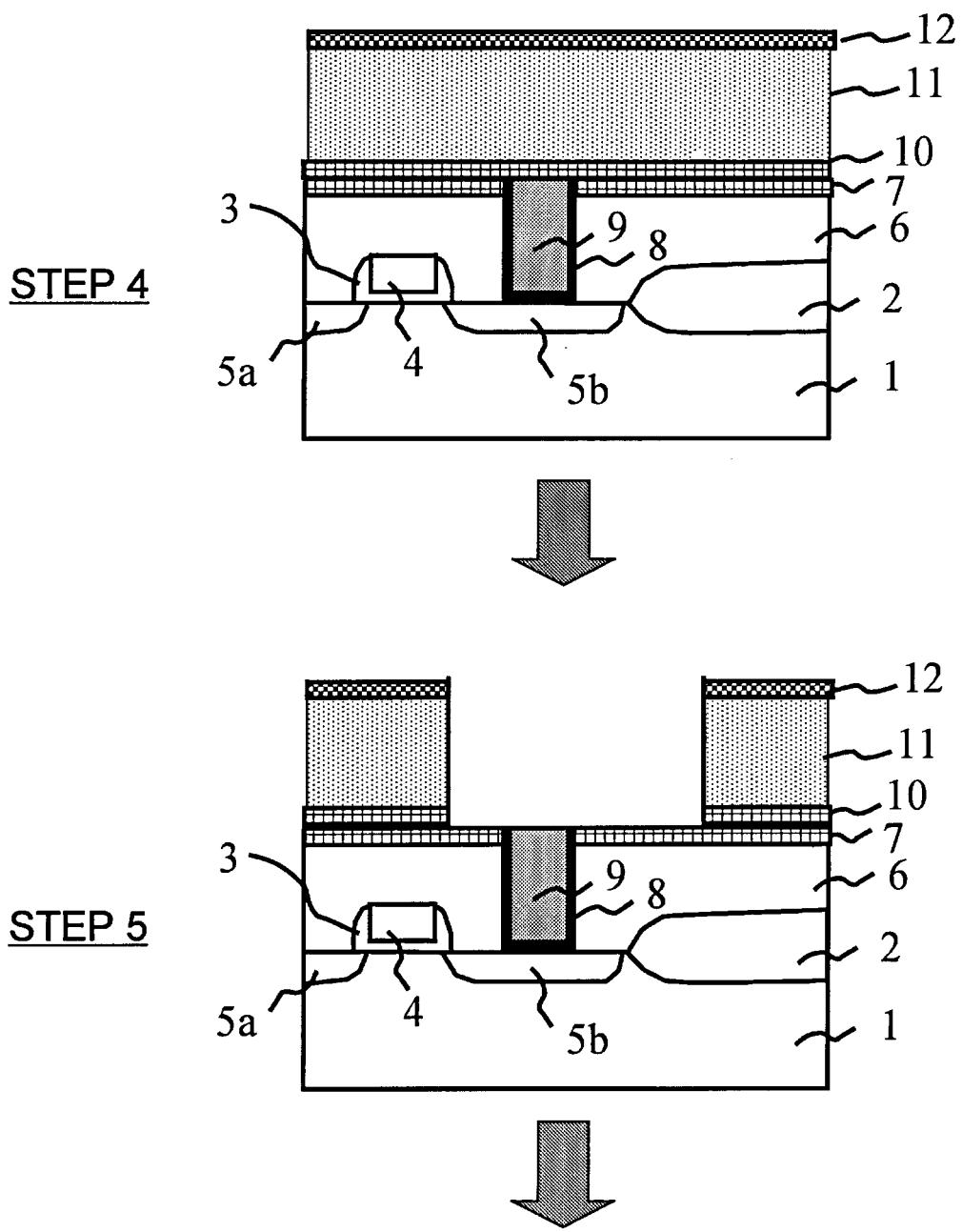
FIG. 2 is a cross-sectional diagram of a multilayer wiring structure under production.
Figure 4:
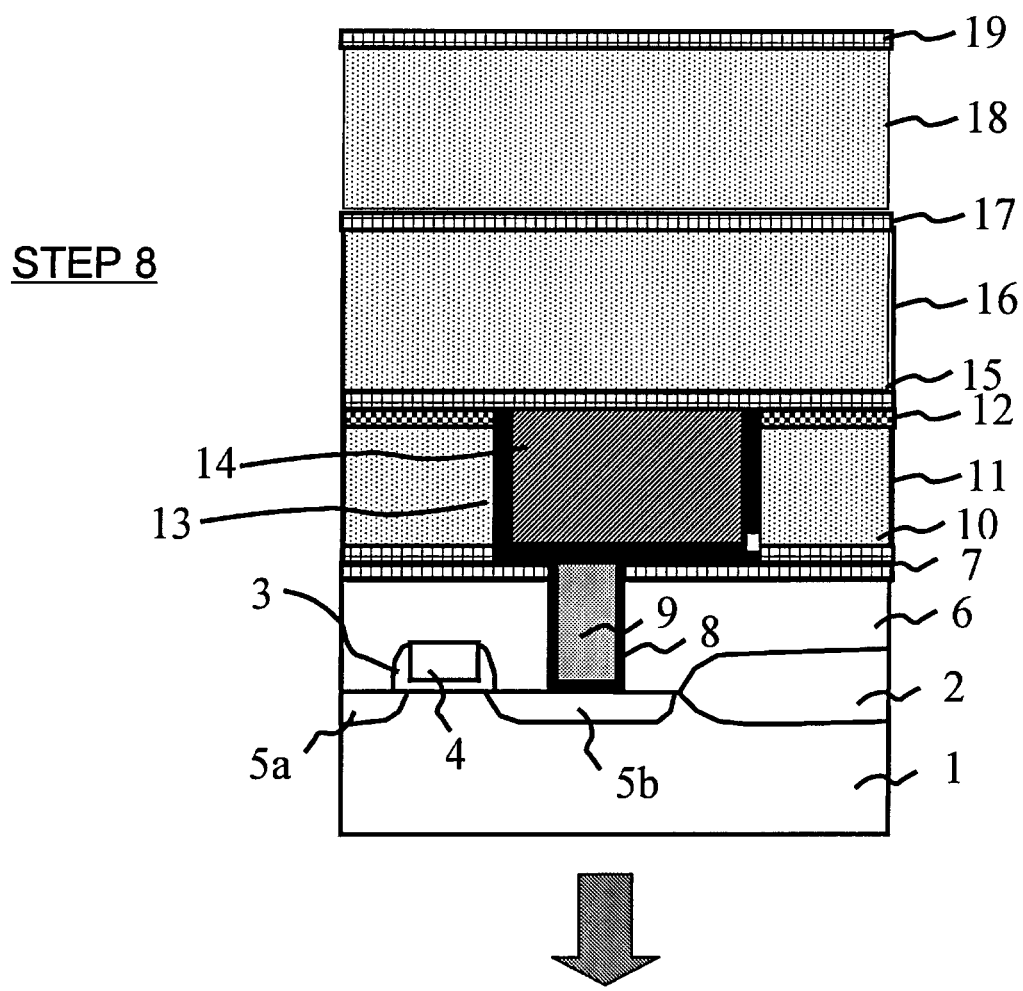
FIG. 4 is a cross-sectional diagram of a multilayer wiring structure under production.
Figure 6:
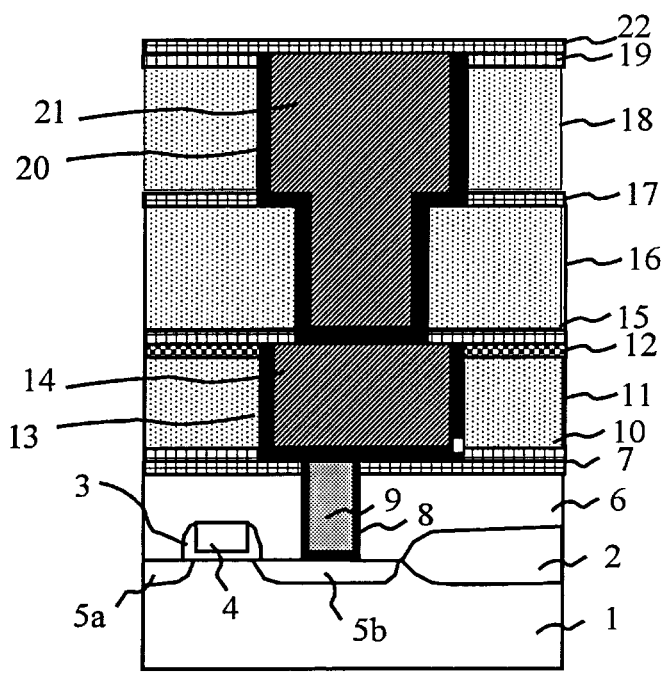
FIG. 6 is a cross-sectional diagram of a multilayer wiring structure under production.

(8) Referring to FIGS. 1 to 6, in Step 1, a silicon wafer 1 was isolated by an inter-device isolation film 2 and had formed thereon a transistor layer on which was formed a gate electrode having a source diffusion layer 5a, a drain diffusion layer 5b, and a sidewall dielectric film 3. In Step 2, an interlayer silicon dielectric 6 and a stopper film 7 were formed on the silicon wafer 1, and a contact hole for leading out an electrode was formed.

In Step 3, a TiN barrier metal film 8 was formed in the contact hole to a thickness of 50 nm by sputtering, following which a blanket of tungsten 9 was buried by mixing $WF_6$ with hydrogen and reduction, then areas other than the via were removed by chemical mechanical polishing (CMP).

Next, in Step 4, a silane compound of the invention was coated, the solvent was removed by drying, then the applied coat was subjected to light irradiation to form a silicic coating 10 according to the present invention (silicic coatings according to the invention which have been provided in this way are referred to below simply as "test films") as an etching stopper film. A porous silicon-containing dielectric film 11 was deposited to a thickness of 160 nm, and a test film 12 was formed as a CMP stopper film.

Then, in Step 5, using as the mask a resist layer provided with a first layer wiring pattern having a 100 nm linewidth and 100 nm spaces, the resulting film stack was etched with a fluorine plasma obtained from $CF_4/CHF_3$ gas as the starting material, thereby forming a wiring trench. Next, in the wiring trench, a test film 13 was formed as a barrier film to copper diffusion to the dielectric layer, and a 10 nm seed layer of copper, which acts as an electrode in electroplating, was formed by sputtering. A 600 nm copper layer 14 was then deposited by electroplating, following which metal in areas other than the wiring pattern was removed by CMP and a 30 nm SiN film 15 was formed by vapor phase deposition, thereby creating a first wiring layer (Step 6).

Next, in Steps 7 and 8, a 180 nm porous silicon-containing dielectric film 16, a test film 17, a 160 nm porous silicon-containing dielectric film 18, and a test film 19 were formed in this order on the wiring layer.

Using as the mask on this dielectric layer a resist layer in which a via pattern has been formed, the test film/porous silicon-containing dielectric film/test film/porous silicon-containing dielectric film were etched in this order by varying the gas composition and pressure using a fluorine plasma prepared from $CF_4/CHF_3$ gas as the starting material. Next, using as the mask a resist layer in which a second layer wiring pattern has been provided, etching was carried out with a fluorine plasma prepared from $CF_4/CHF_3$ gas as the starting material (Step 9).

In this via and the wiring trench, a test film 20 was formed, and a 10 nm seed layer of copper which acts as an electrode in electroplating was formed by sputtering. In addition, a copper layer 21 was deposited to a thickness of 1400 nm by electroplating, following which metal in areas other than the wiring pattern were removed by CMP (Step 10) and a 30 nm SiN film 22 was formed as a diffusion preventing film by vapor phase deposition, thereby forming a second wiring layer (Step 11).

The above steps were then repeated to form three-layer wiring. The test films all had thicknesses of less than 2 nm.

Multilayer wiring structures configured in this way were test-produced using as the test films the silicic coatings obtained in Examples 1 to 7. Using the test-produced multilayer wiring structures, the yield on a 1 million via chain, the wiring resistance, the effective interlayer capacitance, and the presence or absence of copper diffusion to the dielectric layers under electron microscopic examination of the cross-section are shown in Table 2. Determinations of the presence/absence of copper diffusion to the dielectric layers from electron microscopic examination of the cross-section were carried out after treating the multilayer wiring structures in the open air at 200° C. for 1 hour. If no diffusion occurred under these conditions, the barrier film was judged to be acceptable for practical use. Examples 8 to 14 in Table 2 are respectively examples in which the silicic coatings of Examples 1 to 7 were used.

Examples 15 to 21

(9) Multilayer wiring structures were test-produced in which the etching stopper films 10 and 17 and the CMP stopper films 12 and 19 of Examples 8 to 14 were substituted for 30 nm SiC films as conventional etching stopper and CMP stopper films.

Using these multilayer wiring structures, the yield on a 1 million via chain, the wiring resistance, the effective interlayer capacitance, and the presence or absence of copper diffusion to the dielectric layers under electron microscopic examination of the cross-section are shown in Table 3.

Examples 22 to 28

(10) Multilayer wiring structures were test-produced in which the barrier films 13 and 20 for preventing copper diffusion to the dielectric layers of Examples 8 to 14 were substituted for 10 nm TaN films as conventional barrier metal films. Using these multilayer wiring structures, the yield on a 1 million via chain, the wiring resistance, the effective interlayer capacitance, and the presence or absence of copper diffusion to the dielectric layers under electron microscopic examination of the cross-section are shown in Table 4.

Comparative Examples 1 and 2

Instead of the silicic coating in Examples 1 to 7, the conventional barrier metal film TaN and the conventional etching stopper and CMP stopper films (SiC films) shown in Table 1 were formed on a porous silicon-containing dielectric film. A sputtering process was used to form the TaN film, and plasma CVD was used to form the SiC film.

The samples thus obtained were evaluated in the same way as in Examples 1 to 7.

The results are shown in Table 1. From Table 1, it will be appreciated that the silicic coatings according to the present invention can be formed to a thinner film thickness than conventional barrier metal films (the wiring metal diffusion-preventing function is subsequently explained), have an excellent adherence (unlike the comparative examples, separation with the porous silicon-containing dielectric film did not arise in the working examples of the invention), which is an excellent quality for yield improvement, and have a higher etching selectivity than in the comparative examples, which is an excellent quality for a stopper film.

Comparative Example 3

Aside from using SiC films 10, 12, 17, 19 (each having a thickness of 30 nm) identical to that in Comparative Example 2 instead of test film 10, test film 12, test film 17 and test film 19, using TaN films 13 (each having a thickness of 10 nm) identical to that in Comparative Example 1 instead of test film 13 and test film 20, and etching, in order, film according to comparative example/porous silicon-containing dielectric film/film according to comparative example/porous silicon-containing dielectric film instead of etching, in order, test film/porous silicon-containing dielectric film/test film/porous silicon-containing dielectric film, wiring structures were test-produced in the same way as in Examples 8 to 14. Using the test-produced multilayer wiring structures, the yield on a 1 million via chain, the wiring resistance, the effective interlayer capacitance, and the presence or absence of copper diffusion to the dielectric layers under electron microscopic examination of the cross-section are shown in Table 2.

From these wiring metal diffusion results in Tables 2 to 4, it will be appreciated that, even when a silicic coating according to the invention is used, diffusion of the wiring metal can be prevented.

Comparisons of Examples 8 to 28 with Comparative Example 3 having a prior-art configuration showed that: (a) in Examples 8 to 14, compared with the prior-art configuration, excellent properties were obtained for both the wiring resistance and the effective interlayer capacitance, (b) in Examples 15 to 21, compared with the prior-art configuration, the effective interlayer capacity was about the same as in prior-art configurations but the wiring resistance was held to a lower value, and (c) in Examples 22 to 28, compared with the prior-art configuration, the wiring resistance was about the same as in prior-art configurations but the effective interlayer capacitance was held to a lower value. This demonstrates that by employing silicic coatings according to the invention only for barrier films 13, 20 as in Examples 15 to 21, the wiring resistances can be held to lower values than in the prior art; that by employing silicic coatings according to the invention only for stopper films 10, 12, 17, 19 as in Examples 22 to 28, the effective interlayer capacitances can be held to lower values than in the prior art; and that by employing silicic coatings according to the invention for both barrier films 13, 20 and stopper films 10, 12, 17, 19 as in Examples 8 to 14, both the wiring resistance and the effective interlayer capacitance can be held to lower values than in the prior art. Also noteworthy is the fact that the yield in each of these cases is improved compared to the prior-art configuration. On carrying out failure analysis of Comparative Example 3, areas of poor coatability and adherence were present on portions of the barrier metal films and the stopper films, and film separation and copper diffusion were confirmed. By contrast, with regard to the test films in Examples 8 to 28, the film coatability and adherence were good, and film separation and copper diffusion were not observed.

As explained above, stacked dielectric film structures and multilayer wiring structures having a low resistance, low capacitance and a high reliability can be obtained by means of the present invention. Moreover, these multilayer wiring structures are able to contribute in particular to a higher response speed in semiconductor devices.

TABLE 1

| Example | Silane compound | Photosensitive functional group | Functional group X | Light irradiation | Film thickness (nm) | Adherence (kg/cm$^2$) | Etching selectivity | Density (g/cm$^3$) |
|---|---|---|---|---|---|---|---|---|
| Example 1 | trivinylethoxysilane | vinyl group | alkoxy group | UV | <2 | 672 | 9 | 2.44 |
| Example 2 | trivinylethoxysilane | vinyl group | alkoxy group | UV | <2 | 674 | 11 | 2.88 |
| Example 3 | trivinylethoxysilane | vinyl group | alkoxy group | UV (vacuum) | <2 | 672 | 10 | 2.41 |
| Example 4 | trivinylethoxysilane | vinyl group | alkoxy group | UV (400° C.) | <2 | 680 | 10 | 2.68 |
| Example 5 | bis(dimethylamino)diphenylsilane | phenyl group | alkylamino group | UV | <2 | 668 | 11 | 3.25 |

TABLE 1-continued

| Example | Silane compound | Photosensitive functional group | Functional group X | Light irradiation | Film thickness (nm) | Adherence (kg/cm²) | Etching selectivity | Density (g/cm³) |
|---|---|---|---|---|---|---|---|---|
| Example 6 | 4-[2-(trichlorosilyl)ethyl]pyridine | pyridinyl group | chloro group | UV | <2 | 712 | 11 | 3.01 |
| Example 7 | 1,1,3,3-tetraphenyldimethyldisilazane | phenyl group | silazane bond | UV | <2 | 655 | 10 | 2.75 |
| Comp. Ex. 1 | TaN | — | — | — | 10 | 523 | — | 7.64 |
| Comp. Ex. 2 | SiC | — | — | — | 30 | 434 | 6 | — |

(Note)
Adherence: In working examples, failure between the pin and the silicic coating. In comparative examples, failure between the silicic coating and the underlying film.

TABLE 2

| Example | Diffusion of wiring metal | Wiring resistance (mΩ/□) | Effective interlayer capacitance (fF/mm) | Yield (%) |
|---|---|---|---|---|
| Example 8 | none | 115.3 | 156.6 | 97.8 |
| Example 9 | none | 115.0 | 160.1 | 97.7 |
| Example 10 | none | 114.8 | 156.1 | 97.8 |
| Example 11 | none | 115.1 | 158.1 | 97.8 |
| Example 12 | none | 122.0 | 164.0 | 99.8 |
| Example 13 | none | 120.3 | 161.7 | 98.5 |
| Example 14 | none | 124.7 | 159.9 | 99.8 |
| Comp. Ex. 3 | none | 152.3 | 189.6 | 97.1 |

TABLE 3

| Example | Diffusion of wiring metal | Wiring resistance (mΩ/□) | Effective interlayer capacitance (fF/mm) | Yield (%) |
|---|---|---|---|---|
| Example 15 | none | 114.9 | 189.6 | 97.9 |
| Example 16 | none | 115.3 | 188.9 | 97.8 |
| Example 17 | none | 114.5 | 189.5 | 97.6 |
| Example 18 | none | 115.0 | 188.8 | 97.7 |
| Example 19 | none | 121.7 | 189.5 | 99.8 |
| Example 20 | none | 120.9 | 190.0 | 98.0 |
| Example 21 | none | 124.7 | 189.1 | 99.5 |

TABLE 4

| Example | Diffusion of wiring metal | Wiring resistance (mΩ/□) | Effective interlayer capacitance (fF/mm) | Yield (%) |
|---|---|---|---|---|
| Example 22 | none | 152.9 | 156.3 | 97.7 |
| Example 23 | none | 153.1 | 159.5 | 97.7 |
| Example 24 | none | 152.3 | 156.0 | 97.8 |
| Example 25 | none | 152.4 | 157.7 | 97.7 |
| Example 26 | none | 151.3 | 162.9 | 99.5 |
| Example 27 | none | 153.5 | 161.8 | 98.2 |
| Example 28 | none | 151.9 | 160.3 | 99.7 |

The present invention may be utilized in, for example, the barrier films, etching stopper films and CMP stopper films of semiconductor devices.

What is claimed is:

1. A method of producing a silicic coating included in a semiconductor device and having a density of at least 2.4 g/cm³, the method comprising:
   forming a silicic coating precursor by applying at least one type of silane compound having a photosensitive functional group in a solvent to a layer on which the silicic coating is to be formed, followed by heating at a temperature of not more than 150° C. to remove the solvent; and
   thereafter irradiating the silicic coating precursor with at least one type of light, either alone or in combination, to obtain the silicic coating.

2. The method of producing a silicic coating according to claim 1, wherein the silicic coating comprises a barrier film.

3. The method of producing a silicic coating according to claim 2, wherein wiring in contact with the barrier film is copper wiring.

4. The method of producing a silicic coating according to claim 1, wherein the silicic coating comprises an etching stopper film.

5. The method of producing a silicic coating according to claim 1, wherein the silicic coating comprises a stopper film in chemical mechanical polishing.

6. The method of producing a silicic coating according to claim 1, wherein the silane compound comprises a compound represented by any one of general formulas (1) to (3) below

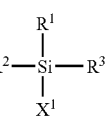

(1)

(2)

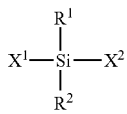

(3)

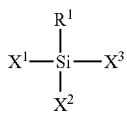

(wherein in formulas (1) to (3), $R^1$, $R^2$ and $R^3$ are each independently hydrogen, an aliphatic hydrocarbon group of 1 to 4 carbons, an aromatic hydrocarbon group of 6 to 8 carbons which may include a substituent, or a heteroaromatic group of 4 to 8 carbons which may include a substituent; and $X^1$, $X^2$ and $X^3$ are each independently chloro, hydroxyl, an alkoxy group of 1 to 3 carbons, or an alkylamino group of 1 to 4 carbons; with the proviso that each of formulas (1) to (3) contains at least one photosensitive functional group as $R^1$, $R^2$ and/or $R^3$).

7. The method of producing a silicic coating according to claim 6, wherein the silane compound comprises a nitrogen-mediated compound obtained by removing at least one of $X^1$, $X^2$ and $X^3$ from each of at least two compounds selected from the group consisting of compounds represented by any one of formulas (1) to (3), and bonding together the at least two compounds through nitrogen.

8. The method of producing a silicic coating according to claim 7, wherein the nitrogen-mediated compound comprises a compound represented by any one of formulas (4) to (7)

(4)

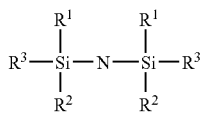

(5)

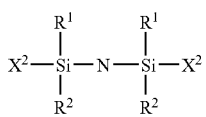

(6)

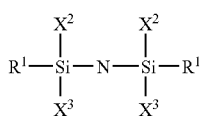

(7)

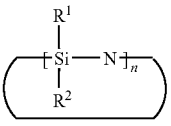

(wherein in formulas (4) to (7), $R^1$, $R^2$ and $R^3$ are each independently hydrogen, an aliphatic hydrocarbon group of 1 to 4 carbons, an aromatic hydrocarbon group of 6 to 8 carbons which may include a substituent, or a heteroaromatic group of 4 to 8 carbons which may include a substituent; $X^2$ and $X^3$ are each independently chloro, hydroxyl, an alkoxy group of 1 to 3carbons, or an alkylamino group of 1 to 4 carbons; and the letter n is an integer from 3 to 5; with the proviso that each of formulas (4) to (7) contains at least one photosensitive functional group as $R^1$, $R^2$ and/or $R^3$).

9. The method of producing a silicic coating according to claim 1, wherein the photosensitive functional group is a group selected from the group consisting of phenyl, vinyl and pyridinyl.

10. The method of producing a silicic coating according to claim 1, wherein the number of photosensitive functional groups which bond to one silicon atom on the silane compound is at least two.

11. The method of producing a silicic coating according to claim 10, wherein the number of photosensitive functional groups which bond to one silicon atom on the silane compound is three.

12. The method of producing a silicic coating according to claim 1, wherein the light is ultraviolet light or an electron beam.

13. The method of producing a silicic coating according to claim 12, wherein the ultraviolet light is vacuum ultraviolet light.

14. The method of producing a silicic coating according to claim 1, further comprising carrying out heat treatment.

15. The method of producing a silicic coating according to claim 14, wherein the heat treatment is carried out at least at any one time from among before the light irradiation, during the light irradiation and after the light irradiation.

16. A silicic coating produced by the method according to claim 1.

17. A semiconductor device comprising a silicic coating produced by the method according to claim 1.

18. The semiconductor device according to claim 17, comprising a multilayer wiring structure.

19. The method of producing a silicic coating according to claim 1, wherein said at least one type of light is ultraviolet light with a wavelength in a range of 200-600 nm.

* * * * *